US012563817B2

(12) United States Patent
Xie et al.

(10) Patent No.: US 12,563,817 B2
(45) Date of Patent: Feb. 24, 2026

(54) INTEGRATING GATE-CUTS AND SINGLE DIFFUSION BREAK ISOLATION POST-RMG USING LOW-TEMPERATURE PROTECTIVE LINERS

(71) Applicant: International Business Machines Corporation, Armonk, NY (US)

(72) Inventors: Ruilong Xie, Niskayuna, NY (US); Balasubramanian S. Pranatharthiharan, Santa Clara, CA (US); Stuart Sieg, Albany, NY (US); Nelson Felix, Slingerlands, NY (US); Veeraraghavan S. Basker, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 866 days.

(21) Appl. No.: 17/545,013

(22) Filed: Dec. 8, 2021

(65) Prior Publication Data

US 2023/0178437 A1     Jun. 8, 2023

(51) Int. Cl.
| | |
|---|---|
| *H10D 84/03* | (2025.01) |
| *H10D 30/01* | (2025.01) |
| *H10D 30/67* | (2025.01) |
| *H10D 62/10* | (2025.01) |
| *H10D 64/01* | (2025.01) |

(Continued)

(52) U.S. Cl.
CPC ......... *H10D 84/038* (2025.01); *H10D 30/031* (2025.01); *H10D 30/67* (2025.01); *H10D 30/6735* (2025.01); *H10D 62/118* (2025.01);

*H10D 64/017* (2025.01); *H10D 84/0135* (2025.01); *H10D 84/0151* (2025.01); *H10D 84/83* (2025.01)

(58) Field of Classification Search
CPC .... H10D 84/038; H10D 30/031; H10D 30/67; H10D 30/6735; H10D 62/118; H10D 64/017; H10D 84/0135; H10D 84/0151; H10D 84/83; H10D 30/43; H10D 30/014; H10D 30/6757; H10D 62/121; B82Y 10/00
See application file for complete search history.

(56) References Cited

U.S. PATENT DOCUMENTS

| | | | |
|---|---|---|---|
| 9,761,495 B1 | 9/2017 | Xie et al. |
| 9,917,103 B1 | 3/2018 | Mulfinger et al. |

(Continued)

*Primary Examiner* — Christine S. Kim
*Assistant Examiner* — Nathalie R Fayette
(74) *Attorney, Agent, or Firm* — Cantor Colburn LLP; Samuel Waldbaum

(57) ABSTRACT

Embodiments of the invention are directed to a method of fabricating an integrated circuit (IC). The method includes performing fabrication operations to form transistors on a substrate. The fabrication operations include forming a sacrificial metal gate and forming a shared non-sacrificial metal gate. The sacrificial metal gate is recessed to form a sacrificial metal gate, and the shared non-sacrificial metal gate is recessed to form a recessed shared non-sacrificial metal gate. A pattern is formed over the sacrificial metal gate and the recessed shared non-sacrificial metal gate. The pattern defines a single diffusion break footprint over a top surface of the sacrificial metal gate, along with a gate-cut footprint over a central region of a top surface of the recessed shared non-sacrificial metal gate.

10 Claims, 9 Drawing Sheets

(51) Int. Cl.
  *H10D 84/01*   (2025.01)
  *H10D 84/83*   (2025.01)

(56)     References Cited

U.S. PATENT DOCUMENTS

| | | | |
|---|---|---|---|
| 10,103,172 B2 | 10/2018 | Agarwal et al. | |
| 10,199,378 B2 | 2/2019 | Jain et al. | |
| 10,468,481 B2 | 11/2019 | Wang et al. | |
| 10,790,372 B2 * | 9/2020 | Greene et al. | H10D 84/038 |
| 10,825,741 B2 | 11/2020 | Zang et al. | |
| 10,896,816 B2 * | 1/2021 | Bi et al. | H10D 30/6757 |
| 10,903,315 B2 | 1/2021 | Loubet et al. | |
| 11,195,928 B2 * | 12/2021 | Lim | H10D 84/834 |
| 11,342,455 B2 * | 5/2022 | Wang et al. | H10D 64/017 |
| 2019/0057867 A1 | 2/2019 | Smith et al. | |
| 2019/0148373 A1 | 5/2019 | Shi et al. | |

* cited by examiner

INTEGRATING GATE-CUTS AND SINGLE DIFFUSION BREAK ISOLATION POST-RMG USING LOW-TEMPERATURE PROTECTIVE LINERS

BACKGROUND

The present invention relates in general to integrated circuits (ICs) and their fabrication. More specifically, the present invention relates to fabrication processes and resulting structures for forming ICs that, after replacement-metal-gate (RMG) operations, integrate gate-cuts and single diffusion break isolation using low-temperature (e.g., less than about 300 degrees Celsius) protective liners.

Semiconductor devices are typically formed using active regions of a wafer. The active regions are defined by isolation regions that separate and electrically isolate adjacent semiconductor devices. In some applications, the isolation regions can include single break diffusion isolation structures that electrically isolate semiconductor devices from one another.

For transistors, a gate-cut process can be used during gate fabrication. A dummy gate can be initially formed as a continuous element that extends across channel regions that are associated with different transistors. A masked etching process can be used to cut the continuous element into individual instances of the dummy gate.

SUMMARY

Embodiments of the invention are directed to a method of fabricating an integrated circuit (IC). The method includes performing fabrication operations to form transistors on a substrate. The fabrication operations include forming a sacrificial metal gate and forming a shared non-sacrificial metal gate. The sacrificial metal gate is recessed to form a sacrificial metal gate, and the shared non-sacrificial metal gate is recessed to form a recessed shared non-sacrificial metal gate. A pattern is formed over the sacrificial metal gate and the recessed shared non-sacrificial metal gate. The pattern defines a single diffusion break footprint over a top surface of the sacrificial metal gate, along with a gate-cut footprint over a central region of a top surface of the recessed shared non-sacrificial metal gate.

Embodiments of the invention are directed to an IC that includes transistors over a substrate. The IC includes a dielectric-filled single diffusion break having an upper single diffusion break region and a lower single diffusion break region. The upper single diffusion break region is above the substrate, and the lower single diffusion break region is below the substrate. A first protective liner is on a first sidewall of the upper single diffusion break region, and a second protective liner is on a second sidewall of the upper single diffusion break region. The first protective liner and the second protective liner are not on sidewalls of the lower single diffusion break region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 2-8 depict top-down and cross-sectional views of portions of an IC after fabrication operations for forming the IC shown in FIG. 1, in which:

FIG. 2 depicts top-down and cross-sectional views of the IC after initial fabrication operations according to embodiments of the invention;

FIG. 3 depicts top-down and cross-sectional views of the IC after fabrication operations according to embodiments of the invention;

FIG. 4 depicts top-down and cross-sectional views of the IC after fabrication operations according to embodiments of the invention;

FIG. 5 depicts top-down and cross-sectional views of the IC after fabrication operations according to embodiments of the invention;

FIG. 6 depicts top-down and cross-sectional views of the IC after fabrication operations according to embodiments of the invention;

FIG. 7 depicts top-down and cross-sectional views of the IC after fabrication operations according to embodiments of the invention; and FIG. 8 depicts top-down and cross-sectional views of the IC after fabrication operations according to embodiments of the invention.

DETAILED DESCRIPTION

Figure 1:
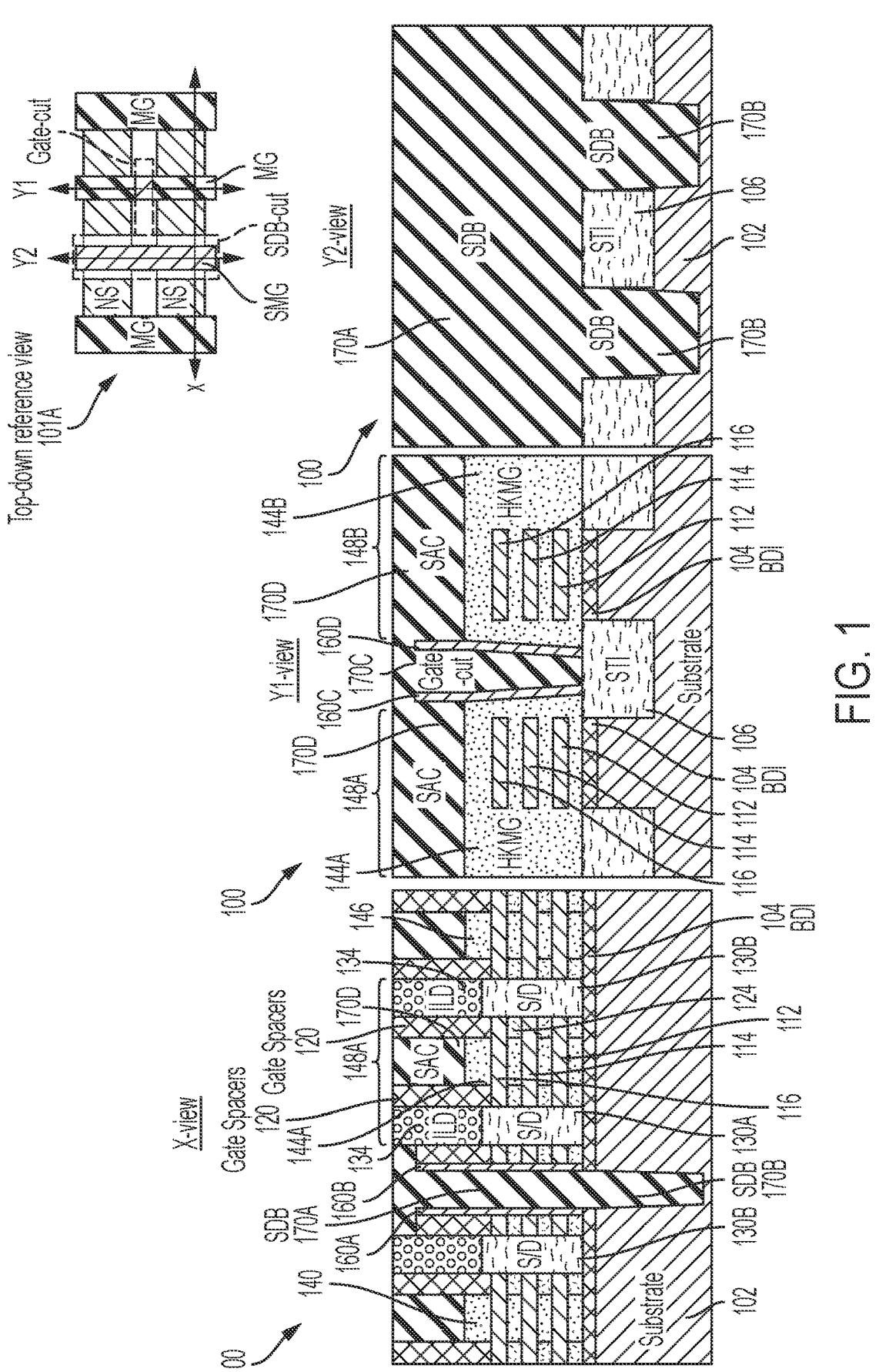
FIG. 1 depicts top-down and cross-sectional views of an integrated circuit (IC) after various fabrication operations to form an IC that, after replacement-metal-gate (RMG) operations, integrates a late gate-cut and single diffusion break isolation using low-temperature (e.g., less than about 300 degrees Celsius) protective liners in accordance with embodiments of the invention.

It is understood in advance that although this invention includes a detailed description of exemplary nanosheet field effect transistor (FET) architectures, embodiments of the invention are not limited to the particular FET architectures or materials described in this specification. Rather, embodiments of the present invention are capable of being implemented in conjunction with any other type of FET architecture (e.g., vertical transport FETs; FinFETs; stacked FETs; and the like) or channel materials (e.g., Si, SiGe, III-V semiconductors, and the like) now known or later developed. Additionally, in this detailed description and the claims, the terms nanosheet and nanowire are treated as synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Non-planar transistor device architectures (e.g., FinFETs and nanosheet FETs) can provide increased device density and increased performance over planar transistors. FinFETs are non-planar, three-dimensional (3D) devices that include a fin-shaped element that defines the source, drain, and channel regions of the FinFET. A gate stack is formed over and around a central region of the fin-shaped element, and the portion of the fin that is under the gate stack functions as the FinFET channel. The portions of the fin-shaped element that are not under the gate stack function as the source region and the drain region, respectively.

Nanosheet FETs are non-planar FETs that increase channel conductivity and decrease FET size by forming the channel as a nanostructure. For example, nanosheet FETs provides a relatively small FET footprint by forming the channel region as a series of stacked and spaced-apart nanosheets. In a known configuration, a nanosheet FET includes a source region; a drain region; and stacked, spaced-apart nanosheet channels between the source and drain regions. A gate surrounds each of the stacked spaced-apart nanosheet channels and regulates electron flow through the nanosheet channels between the source and drain regions. Nanosheet FETs are fabricated by forming alternating layers of channel nanosheets and sacrificial nanosheets. The sacrificial nanosheets are released from the channel nanosheets before the FET device is finalized, thereby forming the stacked, spaced-apart nanosheet channels.

As previously noted herein, two operations used in semiconductor fabrication are single diffusion break isolation operations and gate-cut operations. All ICs have active regions formed from various semiconductor devices (e.g., transistors), along with isolation regions that separate and electrically isolate adjacent semiconductor devices. Conventionally, different active regions are separated with shallow trench isolation (STI) with two dummy gates later formed tucked at edges of active region. This approach consumes very valuable substrate space and it can be difficult to fabricate gate tuck for non-planar semiconductor devices (e.g., nanosheet FETs). As a result, single break diffusion isolation structures can be used to electrically isolate semiconductor devices from one another. In a known process flow, a single diffusion break isolation structure can be formed by removing a portion of a sacrificial dummy gate, etching a trench into the substrate, and filling the trench with an insulating material. A gate-cut process can also be used during the fabrication of semiconductor devices (e.g., nanosheet FETs). The gate can be initially formed as a continuous sacrificial dummy gate element that extend longitudinally across channel regions that are associated with different transistor devices. After forming the continuous sacrificial dummy gate element, a masked etching process can be used to form cuts that divide the continuous sacrificial dummy gate element into individual gate instances.

Turning now to an overview of aspects of the invention, embodiments of the invention provide fabrication processes and resulting structures for forming ICs that, after replacement-metal-gate (RMG) operations, integrate gate-cuts and single diffusion break isolation using low-temperature (e.g., less than about 300 degrees Celsius) protective liners. In embodiments of the invention, a non-limiting embodiment of the invention includes a method of fabricating an IC. The method includes forming a sacrificial metal gate and forming a shared non-sacrificial metal gate. The shared non-sacrificial metal gate is recessed to form a recessed shared non-sacrificial metal gate. A pattern is formed over the sacrificial metal gate and the recessed shared non-sacrificial metal gate to define a single diffusion break footprint over a top surface of the sacrificial metal gate, along with defining a gate-cut footprint over a central region of a top surface of the recessed shared non-sacrificial metal gate. The above-described fabrication operations can further include applying a first etch operation through the pattern to an exposed top surface of the sacrificial metal gate, as well as the exposed central region of the top surface of the recessed shared non-sacrificial metal gate. In accordance with aspects of the invention, applying the first etch operation forms an upper region of a single diffusion break trench under the single diffusion break footprint of the pattern; a gate-cut trench under the gate-cut footprint of the pattern; a first non-sacrificial metal gate; and a second non-sacrificial metal gate. In accordance with aspects of the invention, the above-described pattern can be defined using a single mask in one (or the same) set of trench fabrication and gate-cut operations.

In some embodiments of the invention, the above-described fabrication operations can further include forming a protective liner on sidewalls of the upper region of the single diffusion break trench, as well as on sidewalls of the gate-cut trench. In some embodiments of the invention, forming the protective liner includes depositing the protective liner at a first temperature. In some embodiments of the invention, the first temperature is less than about 300 degrees Celsius. In accordance with embodiments of the invention, the protective liner is deposited using a low-temperature (e.g., below about 300 degrees Celsius) deposition process such as plasma-enhanced ALD (PEALD) to avoid having a high thermal budget after formation of the shared non-sacrificial metal gate.

In some embodiments of the invention, the above-described fabrication operations can further include applying a second etch operation through the pattern to form a lower region of the single diffusion break trench under the single diffusion break footprint of the pattern. In some embodiments of the invention, the lower region of the single diffusion break trench extends into the substrate. The above-described fabrication operations can further include depositing a dielectric material over the IC that forms a dielectric-filled single diffusion break within the upper region of the single diffusion break trench and the lower region of the single diffusion break trench; a dielectric-filled gate-cut within the gate-cut trench; and a cap over the first non-sacrificial metal gate and the second non-sacrificial metal gate.

Embodiments of the invention are also directed to an IC that includes transistors over a substrate. The IC includes a dielectric-filled single diffusion break having an upper single diffusion break region and a lower single diffusion break region. The upper single diffusion break region is above the substrate, and the lower single diffusion break region is below the substrate. A first protective liner is on a first sidewall of the upper single diffusion break region, and a second protective liner is on a second sidewall of the upper single diffusion break region. The first protective liner and the second protective liner are not on sidewalls of the lower single diffusion break region.

In some embodiments of the invention, the above-described IC can further include a dielectric-filled gate-cut configured to separate a first non-sacrificial metal gate from a second non-sacrificial metal gate. A third protective liner is on a first sidewall of the dielectric-filled gate-cut, and a fourth protective liner is on a second sidewall of the dielectric-filled gate-cut. The first protective liner, the second protective liner, the third protective liner, and the fourth protective liner can, in some embodiments of the invention, be formed from the same material. In some embodiments of the invention, the third protective liner is on a cut-sidewall of the first non-sacrificial metal gate; and the fourth protective liner is on a cut-sidewall of the second non-sacrificial metal gate. In some embodiments of the invention, a portion of the third protective liner extends above the first non-sacrificial metal gate and the second non-sacrificial metal gate; and a portion of the fourth protective liner extends above the first non-sacrificial metal gate and the second non-sacrificial metal gate.

In some embodiments of the invention, the IC further includes a shallow trench isolation region within the substrate and beneath the dielectric-filled gate-cut; a first cap over the first non-sacrificial metal gate; a second cap over the second non-sacrificial metal gate; a first stack of spaced-apart nanosheet channels such that the first non-sacrificial metal gate wraps around each of the spaced-apart nanosheet channels in the first stack; and a second stack of spaced-apart nanosheet channels such that the second non-sacrificial metal gate wraps around each of the spaced-apart nanosheet channels in the second stack.

Turning now to a more detailed description of embodiments of the invention, FIG. 1 depicts an X-view, a Y1-view, and a Y2-view of portions of an IC wafer 100 in accordance with embodiments of the invention. Although the X-view, Y1-view, and Y2-view are two-dimensional cross-sectional views, it is understood that the two-dimensional views represent features that have three-dimensions. To assist with visualizing the three-dimensional features, a top-down reference diagram 101A provides a reference point for the X-view, Y1-view, and/or Y2-view shown in FIG. 1. The X-view is a side view taken across four instances of a metal gate (MG); the Y1-view is an end view taken through an active MG that crosses two instances of a nanosheet (NS); and the Y2-view is an end view taken through a sacrificial MG (SMG) that crosses two instances of the NS. A single diffusion break cut (SDB-cut) is defined around the SMG, and a gate-cut is defined over a central region of a third instance of the MG. For ease of illustration and explanation, a limited number of MGs, SMGs, and NSs are depicted. It should be understood, however, that any number of MGs, SMGs, and NSs can be provided in accordance with embodiments of the invention described herein.

As best shown in the X-view and the Y2-view of FIG. 1, the IC 100 includes a first nanosheet FET 148A and a second nanosheet FET 148B formed over a substrate 102. The first nanosheet FET 148A is separated from the second nanosheet FET 148B by a dielectric-filled gate-cut 170C. The first nanosheet FET 148A includes a first instance of several sets of stacked and spaced-apart nanosheets 112, 114, 116; a high-k metal gate (HKMG) 144A; inner spacers 124; a doped source or drain (S/D) 130A; a doped S/D 130B; gate spacers 120; and a self-aligned cap (SAC) 170D, configured and arranged as shown. Similarly, the second nanosheet FET 148B includes a second instance of the several sets of stacked and spaced-apart nanosheets 112, 114, 116; a high-k metal gate (HKMG) 144B; inner spacers (not shown); a first doped S/D (not shown); a second doped S/D (not shown); gate spacers (not shown); and a self-aligned cap (SAC) 170D, configured and arranged as shown. Although not shown, the inner spacers, first doped S/D, second doped S/D, and gate spacers of the second nanosheet FET 148B are substantially the same as the inner spacers 124, doped S/D 130A, doped S/D 130B, and gate spacers 120 of the first nanosheet FET 148A. The first nanosheet FET 148A and the second nanosheet FET 148B are electrically isolated from the substrate 102 by a layer of bottom dielectric insulation (BDI) 104 and shallow trench isolation (STI) regions 106. The IC 100 is stabilized by regions of interlayer dielectric (ILD) 134.

As best shown in the X-view and the Y2-view, a dielectric-filled SDB 170A, 170B includes an upper SDB region 170A and a lower SDB region 170B. The lower SDB region 170B is within the substrate 102, and the upper SDB region 170A is positioned above the substrate 102. The dielectric-filled SDB 170A, 170B electrically isolates the first nanosheet FET 148A and the second nanosheet FET 148B from other regions of the IC 100.

In accordance with aspects of the invention, a first protective liner 160A, a second protective liner 160B, a third protective liner 160C, and a fourth protective liner 160D are provided within the dielectric-filled SDB 170A, 170B and the gate-cut 170C, respectively. More specifically, the first protective liner 160A is provided on a first sidewall of the upper SDB region 170A, and the second protective liner 160B is provided on a second sidewall of the upper SDB region 170A. The first protective liner 160A and the second protective liner 160B are not on the lower SDB region 170B. Similarly, the third protective liner 160C is provided on a first sidewall of the dielectric-filled gate-cut region 170C, and the fourth protective liner 160D is provided on a second sidewall of the dielectric-filled gate-cut region 170C. The third protective liner 160C is also provided on a cut-sidewall 530 (shown in FIG. 5) of the HKMG 144A, and the fourth protective liner 160D is also provided on a cut-sidewall 532 (shown in FIG. 5) of the HKMG 144B. A portion of the third protective liner 160C extends above the HKMG 144A and the HKMG 144B, and a portion of the fourth protective liner 160D extends above the HKMG 144A and the HKMG 144B.

In accordance with aspects of the invention, the HKMGs 140, 144A, 144B, 146 have been recessed prior to formation of the dielectric-filled gate-cut 170C. In embodiments of the invention, recessing the HKMGs 140, 144, 146 shown in FIG. 2 to form the recessed HKMGs 140, 144A, 144B, 146 shown in FIG. 1 is separate from any planarization operations that were applied during an initial formation of the HKMGs 140, 144, 146 shown in FIG. 2. In some aspects of the invention, the recess applied to the HKMGs 140, 144, 146 shown in FIG. 2 to form the recessed HKMGs 140, 144A, 144B, 146 shown in FIG. 1 can be referred to as a post-planarization metal recess. In accordance with aspects of the invention, the recessed HKMGs 144A, 144B reduce the length of the gate-cut and the debris that is generated during the gate-cut operations depicted in FIGS. 3-5 and described in greater detail subsequently herein.

In accordance with aspects of the invention, the gate-cut operations are performed on a selected one of the recessed HKMGs 140, 144, 146 (shown in FIG. 4) instead of on selected ones of precursor dummy gates (not shown) that are provided early in the IC fabrication operations and are subsequently replaced with the HKMGs 140, 142, 144, 146 (shown in FIG. 1) using a replacement metal gate (RMG) operation. In accordance with aspects of the invention, because the metal etch operations that are part of the gate-cut operations and the SDB operations are performed together (or integrated within the same fabrication operation), one mask can be used to form the SDB trench pattern 410 (shown in FIG. 4) and the gate-cut trench pattern 420 (shown in FIG. 4).

In embodiments of the invention, the substrate 102 can be a single crystalline material (e.g., a single crystalline silicon). The substrate 102 can have a variety of configurations, such as a silicon-on-insulator (SOI) or silicon-germanium-on-insulator (SGOI) that includes a bulk semiconductor layer, a buried insulation layer and an active layer. Alternatively, the substrate 102 can have a simple bulk configuration. The substrate 102 can be made of silicon or it can be made of materials other than silicon. Thus, the terms "substrate" or "semiconductor substrate" should be understood to cover all semiconducting materials and all forms of such materials.

Example materials for the components of the first and second nanosheet FETs 148A, 148B will now be provided. The STI regions 106, the layer of BDI 104, and the regions of ILD 134 can each be any suitable dielectric, including, for example, an oxide such as silicon oxide, SiN, SiBCN, SiOCN, SiOC, or combinations thereof. Each of the several instances of the stacked and spaced-apart nanosheets 112, 114, 116 can be any suitable semiconductor material (e.g., Si) capable of functioning as the channel regions of an FET. In some embodiments of the invention, the stacked and spaced-apart nanosheets 112, 114, 116 can be Si with different doping than the Si in the substrate 102. The gate spacers 120 can be any suitable dielectric material (e.g., silicon oxide, silicon nitride, silicon oxynitride, SiBCN, SiOCN, SiOC, or any suitable combination of those materials). The inner spacers 124 can be formed from silicon nitride, silicoboron carbonitride, silicon carbonitride, silicon carbon oxynitride, or any other type of dielectric material (e.g., a dielectric material having a dielectric constant k of less than about 5). The doped S/D regions 130A, 130B can be any suitable doped semiconductor material. In some embodiments of the invention, the doped S/D regions 130A, 130B can be epitaxially grown and in-situ doped, thereby creating the necessary junctions for first and second nanosheet FETs 148A, 148B. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

The first protective liner 160A, the second protective liner 160B, the third protective liner 160C, and the fourth protective liner 160D can be formed from a nitride material such as SiN deposited at a low-temperature (e.g., below about 300 degrees Celsius). The HKMGs 140, 144A, 144B, 146 each include a thin gate oxide (not shown separately) and a metal gate (not shown separately. The metal gate can include work-function metals (WFM) and conductive metals. In embodiments of the invention, the WFM can be, for example, TiN, TiAlC, or TiC; and the conductive metal can be aluminum or tungsten. The thin gate oxide can include interfacial layers (IL) and high-k dielectric layers. In some embodiments of the invention, the high-k dielectric layers can modify the work function of the WFM. The gate dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

Figure 2:
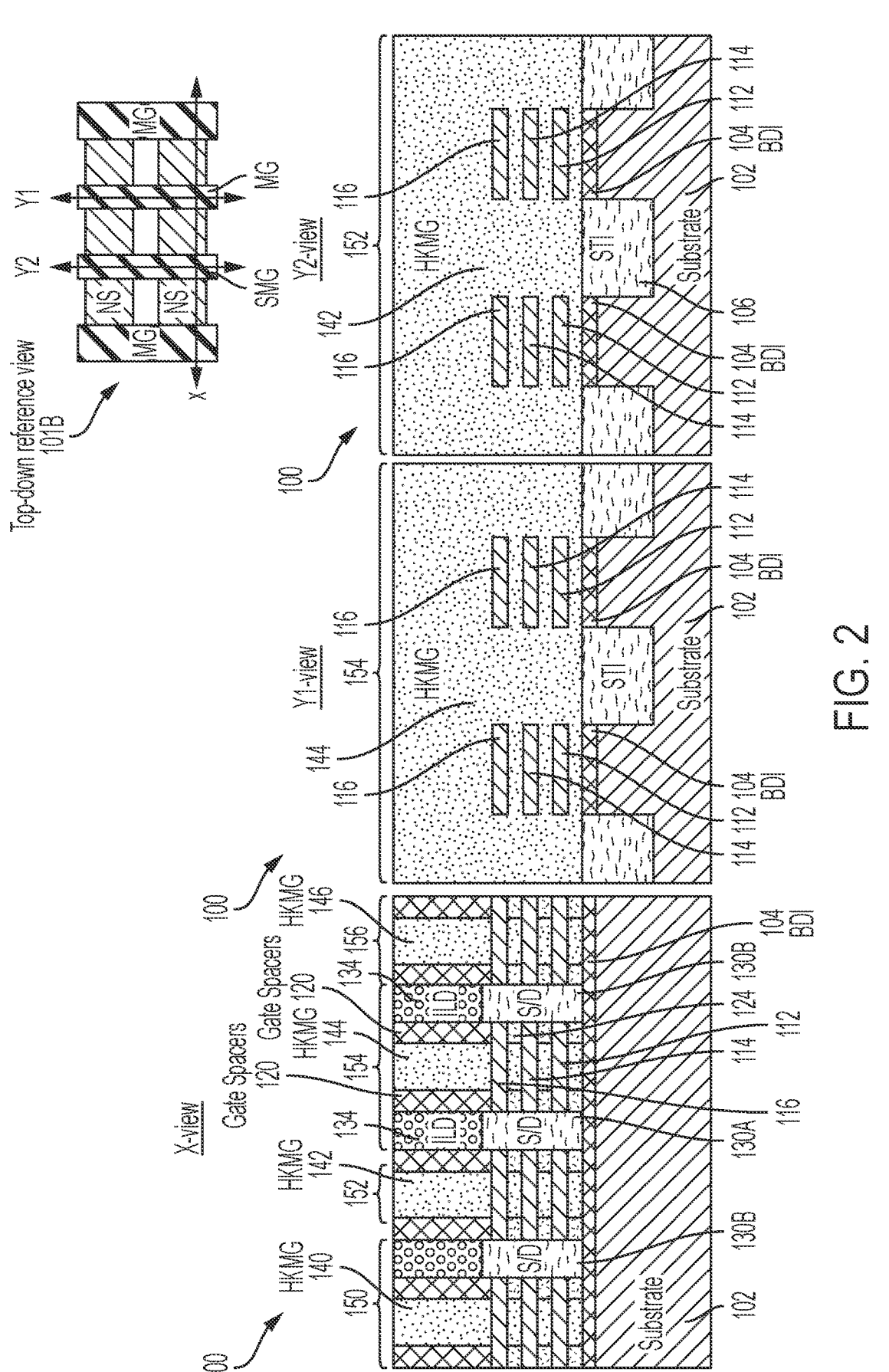

FIGS. 2-8 depict one of the top-down reference view 101A, 101B, along with the corresponding cross-sectional X-view, Y1-view, and Y2-view showing the IC 100 after fabrication operations for forming the IC 100 shown in FIG. 1. Referring initially to FIG. 2, as best shown in the X-view, known fabrication operations have been used to form the IC 100 to include a set of in-series nanosheet FET structures in a first region 150, a second region, 152, a third region 154, and a fourth region 156 of the IC 100. FIG. 2 includes a top-down reference view 102B, which is identical to the top-down reference view 101A, except the SDB-cut region and the gate-cut region are shown in the top-down reference view 101A but not shown in the top-down reference view 101B. The in-series nanosheet FET structure in the first region 150 includes the HKMG 140; the in-series nanosheet FET structure in the second region 152 includes a sacrificial HKMG 142; the in-series nanosheet FET structure in the third region 154 includes an HKMG 144; and the in-series nanosheet FET structure in the first region 156 includes HKMG 146. As best shown in the Y1-view, the HKMG 144 is a precursor to the HKMG 144A and the HKMG 144B shown in FIG. 1; and the in-series nanosheet FET structure in the third region 154 is a precursor to the first nanosheet FET 148A and the second nanosheet FET 148B shown in FIG. 1. A known RMG process can be used to form the HKMGs 140, 142, 144, 146, and a planarization process has been applied to the IC 100 (including the HKMGs 140, 142, 144, 146) form the IC 100 shown in FIG. 1. Accordingly, the HKMGs 140, 142, 144, 146 can be referred to as planarized the HKMGs 140, 142, 144, 146.

Figure 3:
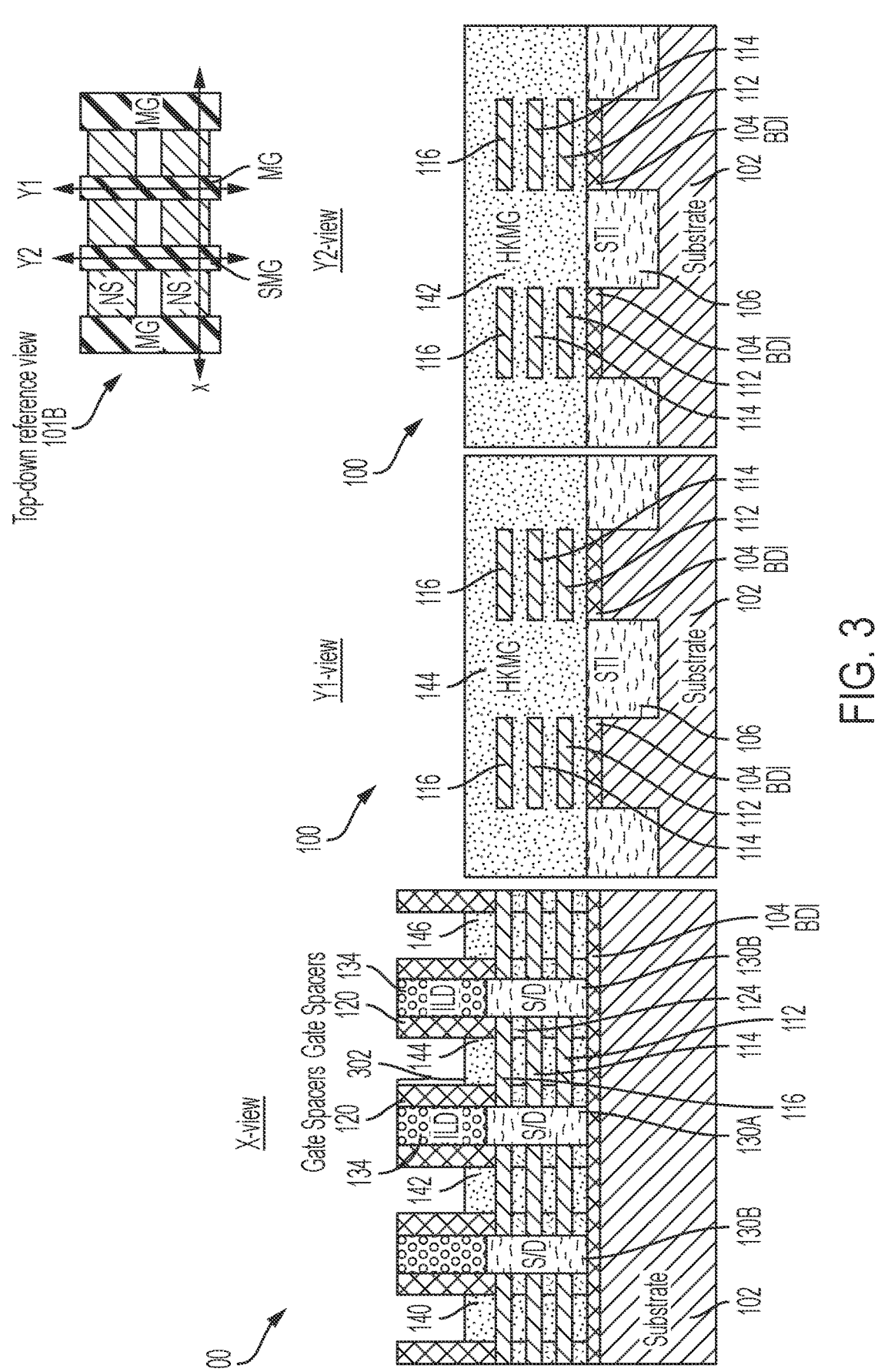

In FIG. 3, as best shown in the X-view, the Y1-view, and the Y2-view, known fabrication operations have been used to recess the planarized HKMGs 140, 142, 144, 146 shown in FIG. 2 to form recessed HKMGs 140, 142, 144, 146 shown in FIG. 3. The recessed HKMGs 140, 142, 144, 146 can be recessed using any suitable method, such as a wet etch, a dry etch, or a combination of sequential wet and/or dry etches. In some embodiments of the invention, the recessed HKMGs 140, 142, 144, 146 are recessed selective to the gate spacers 120. As best shown in the X-view, a recess depth 302 of the recessed HKMGs 140, 142, 144, 146 is controlled to allow the recessed HKMGs 140, 142, 144, 146 to meet performance requirements of the application in which the IC 100 will be deployed while also reducing the amount of damage caused to exposed surfaces of the IC 100 from etched metal debris that results from the gate recess. In some embodiments of the invention, the recess depth 302 can be within a range from about 15 nm to 50 nm, although other recess depths are contemplated as being within the scope of embodiments of the invention.

Figure 4:
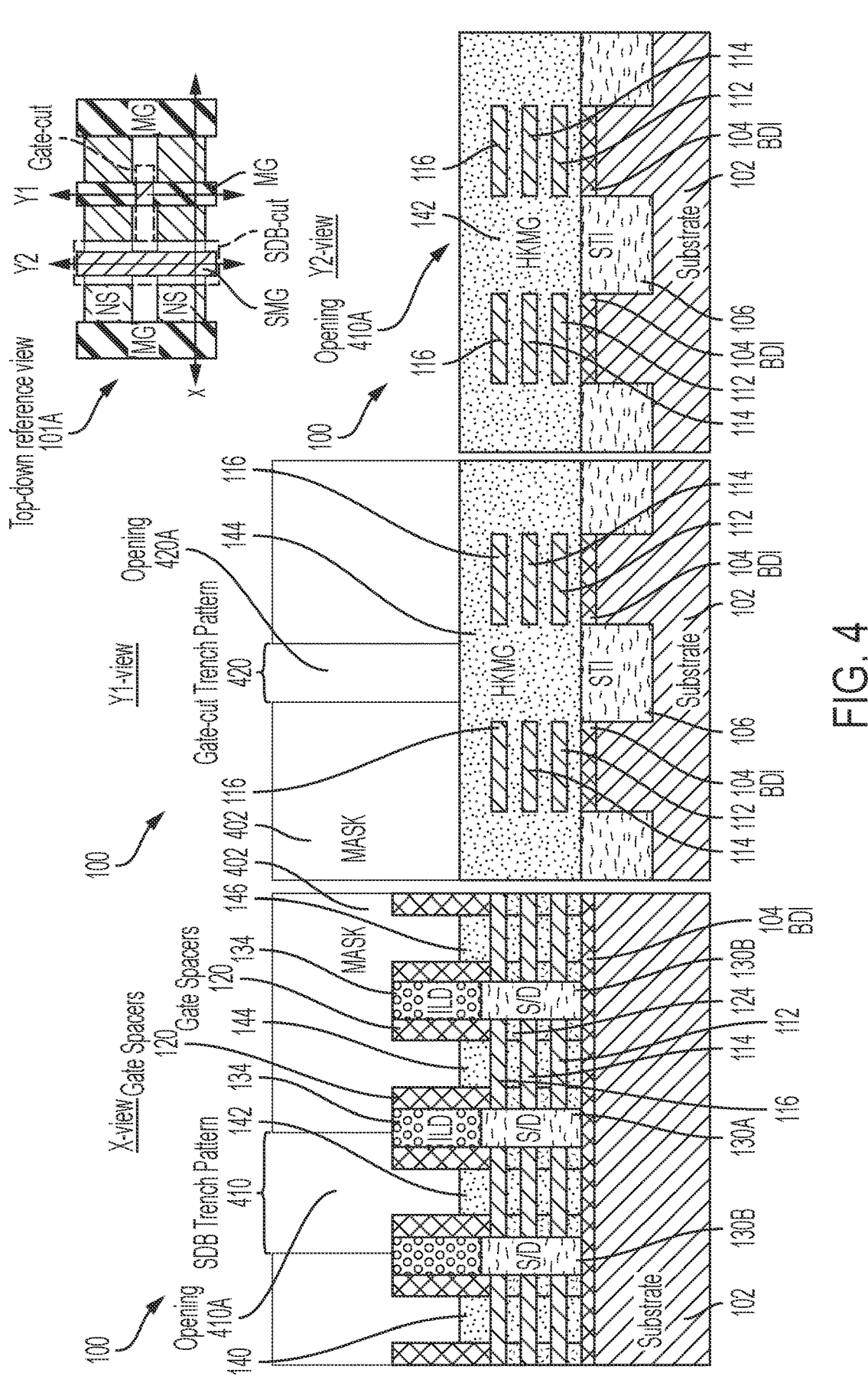

In FIG. 4, as best shown in the X-view, the Y1-view, and the Y2-view. SDB openings 410A and gate-cut openings 420A are defined (e.g., using SDB trench pattern 410 and gate-cut trench pattern 420) in a mask 402 using a single lithographic exposure and etch process. In embodiments of the invention, the SDB trench pattern (or footprint) 410 corresponds to the SDB-cut shown in the top-down reference view 101A; and the gate-cut trench pattern (or footprint) 420 corresponds to the gate-cut shown in the top-down reference view 101A. In embodiments of the invention, the mask 402 can be formed from any suitable material, including, for example, spin-on carbon (SOC) and/or OPL. In general, OPLs are used as etch masks for pattern transfers into inorganic substrates, to fill pre-existing features, and to planarize a substrate to allow for larger patterning process windows. While both SOC and OPL materials are generally suitable for embodiments of the invention, SOC is better suited to withstand a higher down-stream thermal budget.

Referring still to FIG. 4, the mask 402 is a single mask used to define the SDB trench pattern 410 and the gate-cut trench pattern 420 in one (or the same) set of trench fabrication operation. The mask 402 can be a photolithography mask or an extreme ultraviolet lithography (EUV) mask. A photolithography mask is an opaque plate or film with transparent areas that allow light to shine through a defined pattern on a photoresist layer. EUV masks work by reflecting light, which is achieved by using multiple alternating layers of molybdenum and silicon. In either case, an etch operation is applied to remove regions of the mask 402 defined by the SDB trench pattern 410 and the gate-cut trench pattern 420, thereby forming the openings 410A, 420A and exposing selected surfaces of the IC 100 as shown. The opening 410A initially exposes a top surface of the sacrificial HKMG 142, and the opening 420A exposes a top surface of the recessed HKMG 144.

Figure 5:
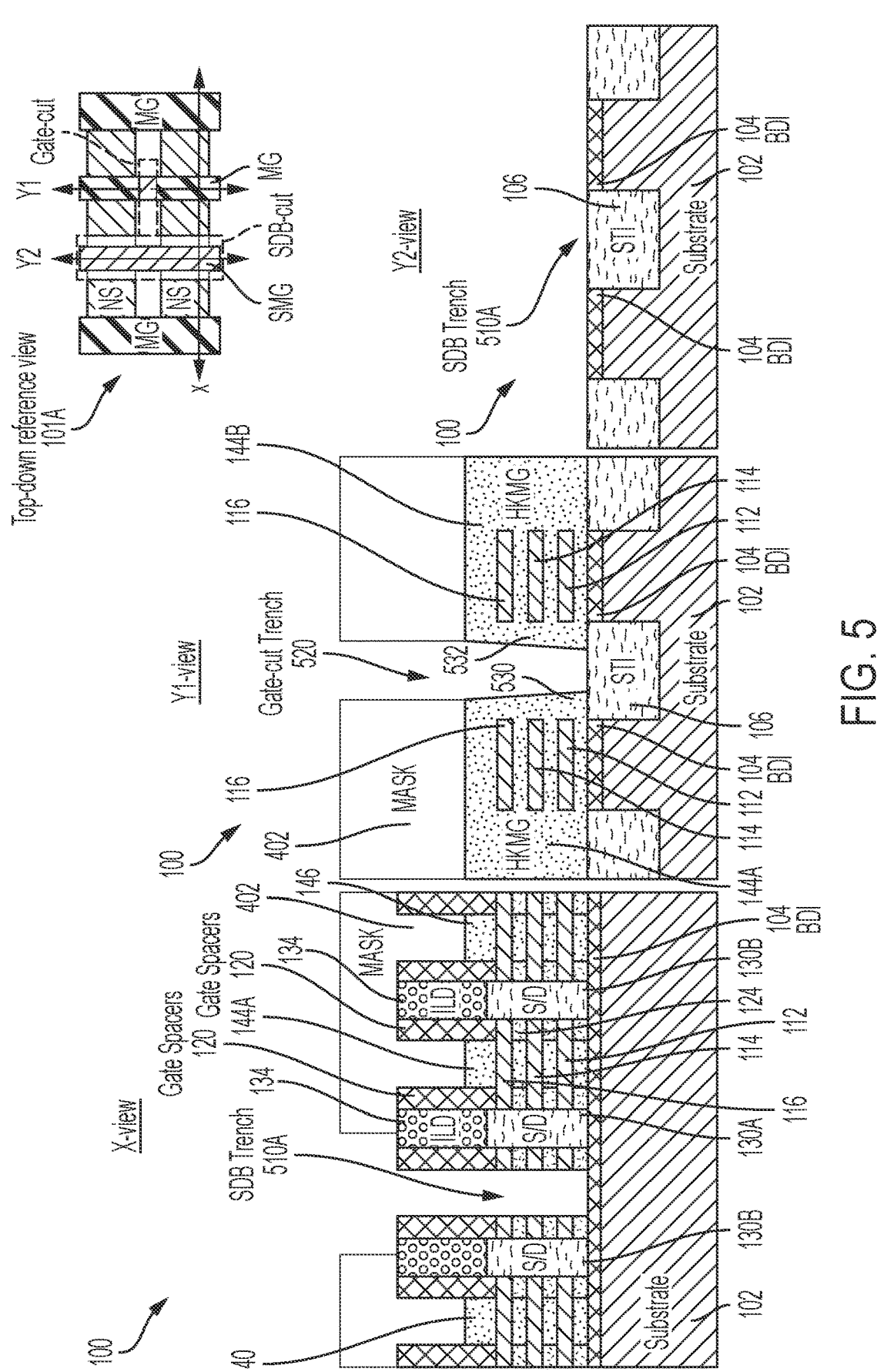

In FIG. 5, as best shown in the X-view, the Y1-view, and the Y2-view, known fabrication operations (e.g., gate/nanosheet cut techniques) have been used to form an upper SDB trench 510A and a gate-cut trench 520 by removing the sacrificial HKMG 142 that has been exposed by the opening 410A; removing an instance of the sets of stacked and spaced-apart nanosheets 112, 114, 116 that is surrounded by the sacrificial HKMG 142; and removing a central region of the HKMG 144 that has been exposed by the opening 420A. Removing the central region of the HKMG 144 exposed by the opening 420A creates the HKMG 144A and the HKMG 144B. The resulting HKMG 144A includes the cut-sidewall 530, and the resulting HKMG 144B includes the cut-sidewall 532.

Figure 6:
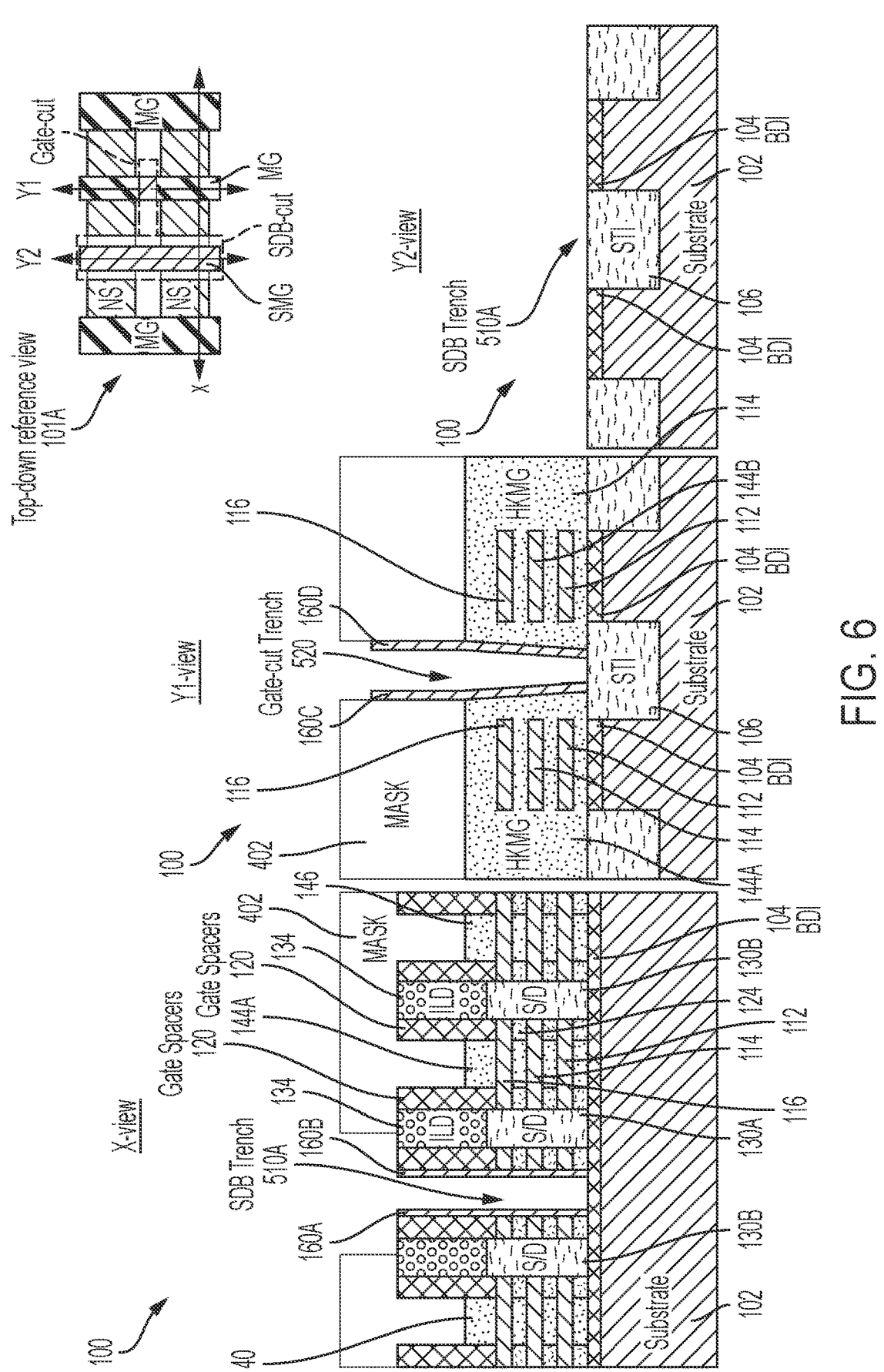

In FIG. 6, as best shown in the X-view and the Y1-view, known fabrication operations have been used to conformally deposit a protective liner (not shown separately) over exposed surface of the IC 100. An anisotropic etch is applied to remove the conformally deposited protective liner from exposed horizontal surfaces of the IC 100, thereby leaving a first protective liner 160A and a second protective liner 160B on sidewalls of the upper SDB trench 510A to protect the sidewalls of the upper SDB trench 510A during downstream etching operations; and leaving a third protective liner 160C and a fourth protective liner 160D on sidewalls of the gate-cut trench 520 to protect the sidewalls of the gate-cut trench 520 during downstream etch operations. A portion of the third protective liner 160C is on (and protects) the cut-sidewall 530 (shown in FIG. 5) of the recessed HKMG 144A; and a portion of the fourth protective liner 160D is on (and protects) the cut-sidewall 532 (shown in FIG. 5) of the recessed HKMG 144B.

In accordance with embodiments of the invention, the above-described conformal protective liner (not shown) is deposited using a low-temperature (e.g., below about 300 degrees Celsius) deposition process such as plasma-enhanced ALD (PEALD) to avoid having a high thermal budget after formation of the recessed HKMGs 140, 144A, 144B, 146.

Figure 7:
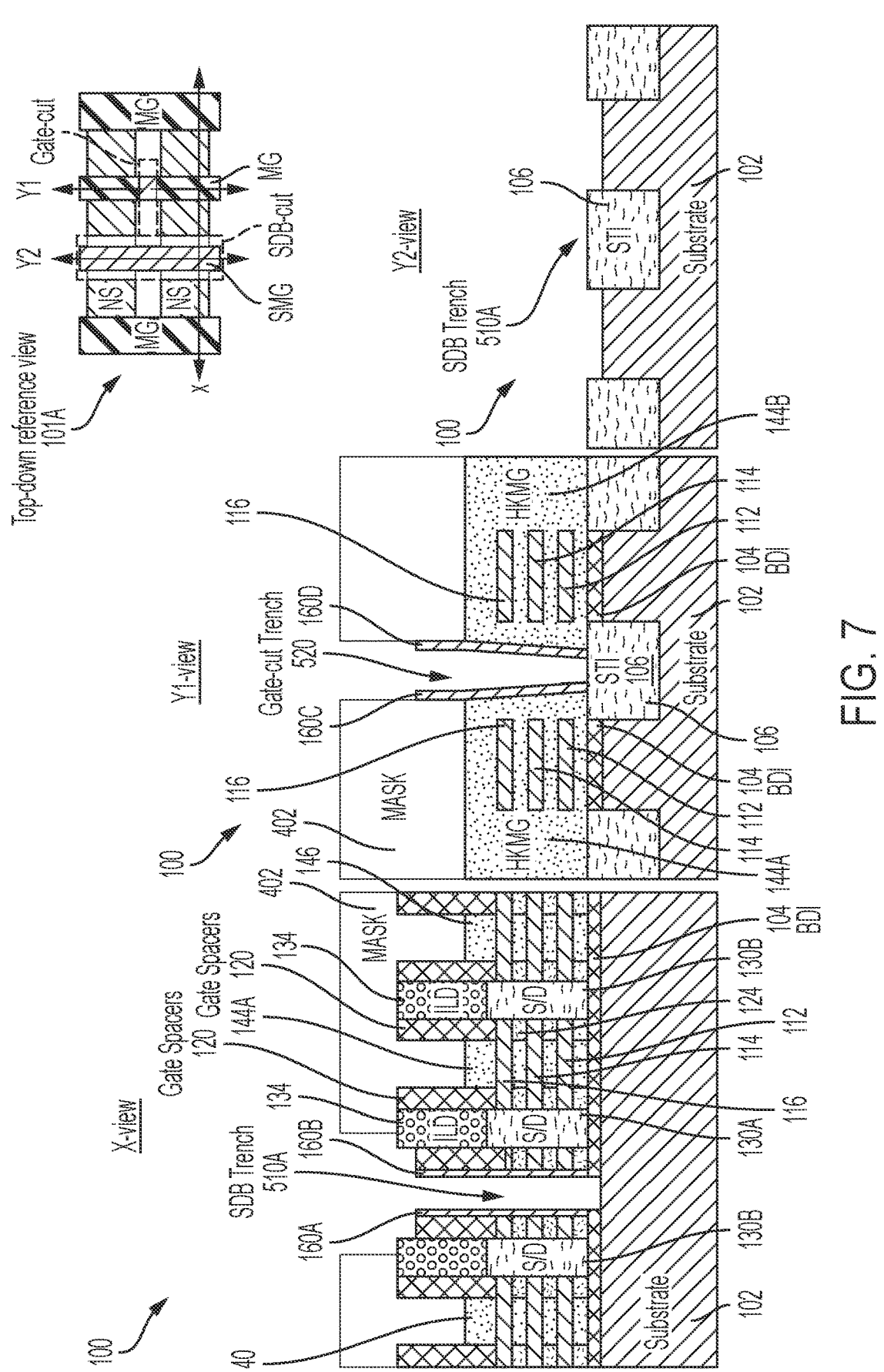

In FIG. 7, as best shown in the X-view and the Y2-view, known fabrication operations (e.g., RIE) has been used to remove the BDI 104 from beneath the SDB trench 510A, thereby exposing top surfaces of the substrate 102 (best shown in the Y2-view). The RIE used to remove the BDI 104 can also reduce a height of the exposed gate spacers 120 and the first, second, third, and fourth protective liners 160A, 160B, 160C, 160D. The first protective liner 160A and the second protective liner 160B on sidewalls of the upper SDB trench 510A protect the sidewalls of the upper SDB trench 510A during etching of the BDI 104. The third protective liner 160C and the fourth protective liner 160D on the sidewalls of the gate-cut trench 520 protect the sidewalls of the gate-cut trench 520 during etching of the BDI 104.

Figure 8:
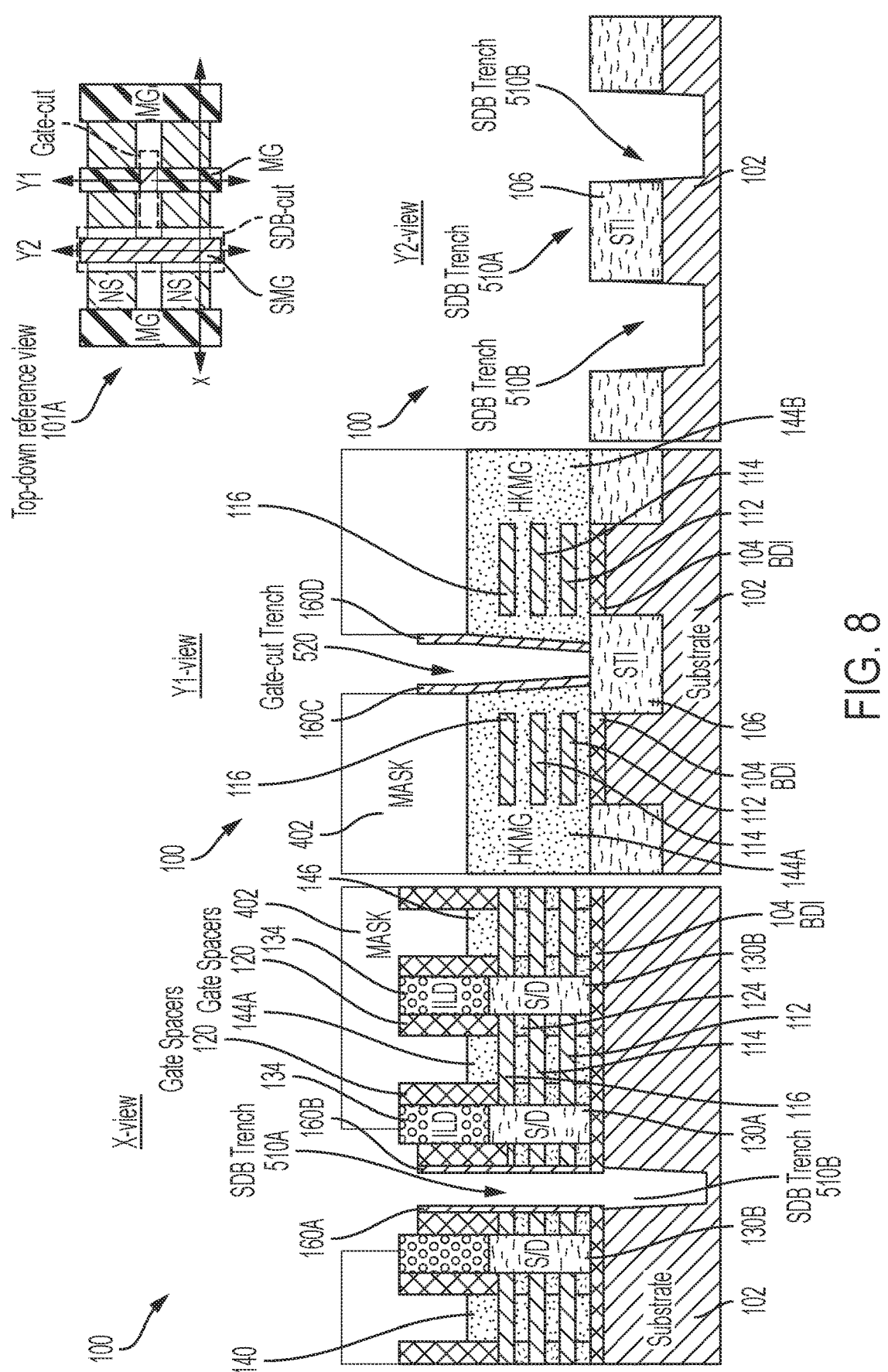

In FIG. 8, as best shown in the X-view and the Y2-view, known fabrication operations (e.g., a RIE) have been used to etch exposed portions of the substrate 102 at the bottom of the SDB trench 510A to form lower SDB trenches 510B.

After the fabrication operations depicted in FIG. 8, known fabrication operations are used to form the IC 100 depicted in FIG. 1 by removing the mask 402 (e.g., using an ash removal operation) then depositing and planarizing a dielectric over the IC 100, thereby forming the SAC 170D, the dielectric-filled SDB 170A, 170B, and the dielectric-filed gate-cut 170C.

Figure 9:
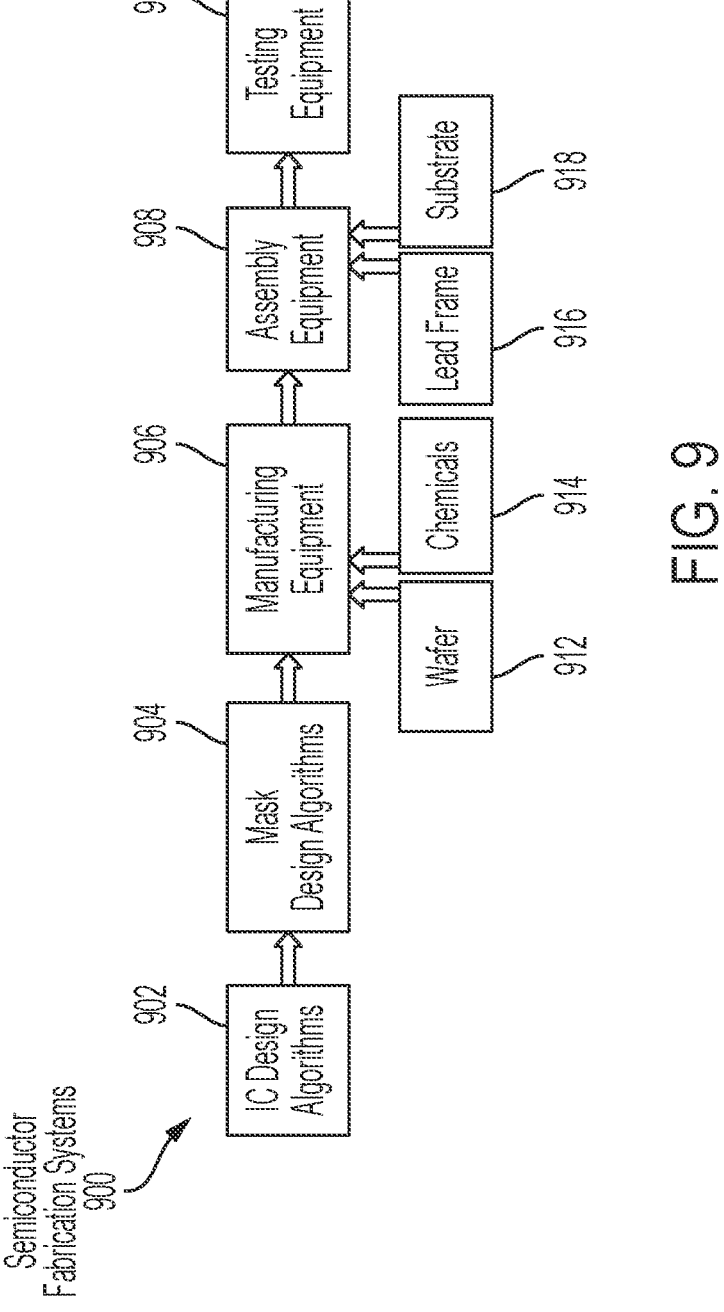
FIG. 9 depicts semiconductor fabrication systems capable of implementing embodiments of the invention.

FIG. 9 depicts a block diagram illustrating semiconductor fabrication systems 900 that supports semiconductor fabrication processes capable of incorporating aspects of the invention. The semiconductor fabrication systems 900 includes IC design support algorithms 902, mask design support algorithms 904, manufacturing support equipment 906, assembly support equipment 908, and testing support equipment 910, configured and arranged as shown. The IC design support algorithms 902 are configured and arranged to provide computer-aided-design (CAD) assistance with the design of the logic circuits (AND, OR, and NOR gates) that form the various logic components of the IC. Similarly, the mask design support algorithms 904 are configured and arranged to provide CAD assistance with generating the mask design, which is the representation of an IC in terms of planar geometric shapes that correspond to the patterns of metal, oxide, or semiconductor layers that make up the components of the IC. The mask design places and connects all of the components that make up the IC such that they meet certain criteria, such as performance, size, density, and manufacturability. The manufacturing equipment 906 is the equipment used in executing the FEOL, MOL, BEOL, and Far-BEOL processes (including singulation processes) used to form the finished wafers and IC chips (or semiconductor die). In general, the wafer manufacturing equipment 906 come in various forms, most of which specialize in growing, depositing or removing materials from a wafer. Examples of wafer manufacturing equipment 906 include oxidation systems, epitaxial reactors, diffusion systems, ion implantation equipment, physical vapor deposition systems, chemical vapor deposition systems, photolithography equipment, etching equipment, polishing equipment and the like. The various types of manufacturing equipment 902 take turns in depositing and removing (e.g., using the chemicals 914) different materials on and from the wafer 912 in specific patterns until a circuit is completely built on the wafer 912. The assembly equipment 908 is used to package the IC chips into finished IC packages that are physically ready for use in customer applications. The assembly equipment 908 can include wafer back-grind systems, wafer saw equipment, die attach machines, wire-bonders, die overcoat systems, molding equipment, hermetic sealing equipment, metal can welders, DTFS (de-flash, trim, form, and singulation) machines, branding equipment, and lead finish equipment. The major components used by the assembly equipment 908 include but are not limited to lead frames 916 and substrates 918. The test equipment 910 is used to test the IC packages so that only known good devices will be shipped to customers. Test Equipment 910 can include automatic test equipment (ATE); test handlers; tape and reel equipment; marking equipment; burn-in ovens; retention bake ovens; UV (ultraviolet) erase equipment, and vacuum sealers.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated circuit (IC) comprising transistors over a substrate, wherein the IC comprises:
   a dielectric-filled single diffusion break comprising an upper single diffusion break region and a lower single diffusion break region;
   wherein the upper single diffusion break region is above a top surface of the substrate; wherein the lower single diffusion break region is below the top surface of the substrate;
   wherein the transistors comprise a first transistor and a second transistor;
   a first protective liner on and in direct contact with:
      a first sidewall of the upper single diffusion break region; and
      a channel of the first transistor; and
   a second protective liner on and in direct contact with:
      a second sidewall of the upper single diffusion break region; and
      a channel of the second transistor;
   wherein the first protective liner and the second protective liner are not on sidewalls of the lower single diffusion break region.

2. The IC of claim 1, wherein:
   the channel of the first transistor comprises a first stack comprising spaced-apart nanosheet channels having spaced-apart nanosheet channel sidewalls;
   the channel of the second transistor comprises a second stack comprising spaced-apart nanosheet channels having spaced-apart nanosheet channel sidewalls;
   the first protective liner on the channel of the first transistor comprises the first protective liner on the spaced-apart nanosheet channel sidewalls of the first stack; and
   the second protective liner on the channel of the second transistor comprises the second protective liner on the spaced-part nanosheet channel sidewalls of the second stack.

3. The IC of claim 2, wherein:
   the first stack further comprises spaced-apart inner spacers;
   the second stack further comprises spaced-apart inner spacers;

the first proactive liner on the channel of the first transistor further comprises the first protective liner on sidewalls of the spaced-apart inner spacers of the first stack; and the second proactive liner on the channel of the second transistor further comprises the second protective liner on sidewalls of the spaced-apart inner spacers of the second stack.

4. The IC of claim 1 further comprising:

a dielectric-filled gate-cut configured to separate a first non-sacrificial metal gate from a second non-sacrificial metal gate;

a third protective liner on a first sidewall of the dielectric-filled gate-cut and extending above the first non-sacrificial metal gate;

a fourth protective liner on a second sidewall of the dielectric-filled gate-cut and extending above the second non-sacrificial metal gate; and a third transistor;

wherein the first transistor comprises the first non-sacrificial metal gate; and wherein the third transistor comprises the second non-sacrificial metal gate.

5. The IC of claim 4, wherein the first protective liner, the second protective liner, the third protective liner, and the fourth protective liner comprise the same material.

6. The IC of claim 4, wherein the third protective liner is on a cut-sidewall of the first non-sacrificial metal gate.

7. The IC of claim 6, wherein the fourth protective liner is on a cut-sidewall of the second non-sacrificial metal gate.

8. The IC of claim 7, wherein a portion of the third protective liner extends above the first non-sacrificial metal gate and the second non-sacrificial metal gate.

9. The IC of claim 8, wherein a portion of the fourth protective liner extends above the first non-sacrificial metal gate and the second non-sacrificial metal gate.

10. The IC of claim 9 further comprising:

a shallow trench isolation region within the substrate and beneath the dielectric-filled gate-cut;

a first cap over the first non-sacrificial metal gate; and a second cap over the second non-sacrificial metal gate;

wherein the channel of the first transistor comprises a first stack comprising spaced-apart nanosheet channels having spaced-apart nanosheet channel sidewalls;

wherein the channel of the second transistor comprises a second stack comprising spaced-apart nanosheet channels having spaced-apart nanosheet channel sidewalls;

wherein the third transistor comprises a third stack comprising spaced-apart nanosheet channels;

wherein the first non-sacrificial metal gate wraps around each of the spaced-apart nanosheet channels in the first stack; and wherein the second non-sacrificial metal gate wraps around each of the spaced-apart nanosheet channels in the third stack.

* * * * *